United States Patent [19]

Ogawa et al.

[11] 4,419,425

[45] Dec. 6, 1983

[54] METHOD FOR MANUFACTURING COLOR FILTER

[75] Inventors: Kazufumi Ogawa, Hirakata; Isamu Kitahiro, Yawata, both of Japan

[73] Assignee: Matsushita Electric Industrial Co., Ltd., Tokyo, Japan

[21] Appl. No.: 380,344

[22] Filed: May 20, 1982

[30] Foreign Application Priority Data

May 20, 1981 [JP] Japan ................................. 56-77199

[51] Int. Cl.³ .............................................. G03C 5/00
[52] U.S. Cl. ...................................... 430/7; 430/321; 430/325; 430/326; 430/329
[58] Field of Search ................. 430/7, 24, 25, 26, 395, 430/396, 321, 329, 325, 326

[56] References Cited

U.S. PATENT DOCUMENTS

| | | | |
|---|---|---|---|
| 3,330,682 | 7/1967 | Tamura | 430/7 |
| 3,615,462 | 10/1971 | Szegho et al. | 430/25 |
| 3,661,580 | 5/1972 | Mayaud | 430/25 |
| 4,251,610 | 2/1981 | Haven et al. | 430/25 |
| 4,324,850 | 4/1982 | Tomita et al. | 430/396 |
| 4,339,514 | 7/1982 | Biber | 430/7 |
| 4,357,415 | 11/1982 | Hartman | 430/7 |

Primary Examiner—J. Travis Brown
Attorney, Agent, or Firm—Burgess, Ryan & Wayne

[57] ABSTRACT

Proposed is a method for manufacturing a color filter having the steps of: forming a stripe- or lattice-shaped light-shield pattern on one major surface of a transparent glass substrate; forming a photosensitive base film on the same major surface of the glass substrate on which the light-shield pattern is formed; exposing the photosensitive base film by light radiated from the other major surface of the glass substrate, using the light-shield pattern as a mask, developing the base film to remove a nonexposed portion of the photosensitive base film immediately above the light-shield pattern and to divide the photosensitive base film along the light-shield pattern; and selectively dyeing divided base film portions to form color layers.

4 Claims, 34 Drawing Figures

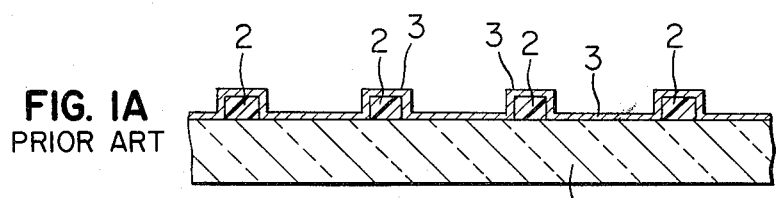
FIG. IA PRIOR ART
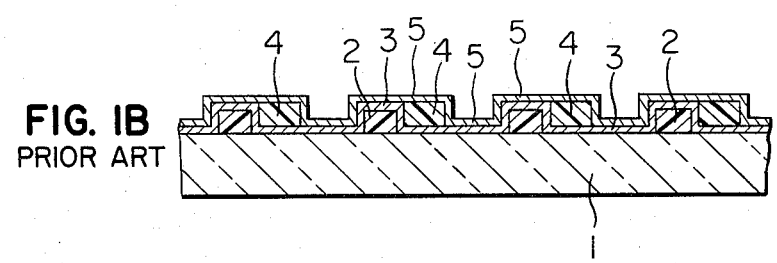
FIG. IB PRIOR ART
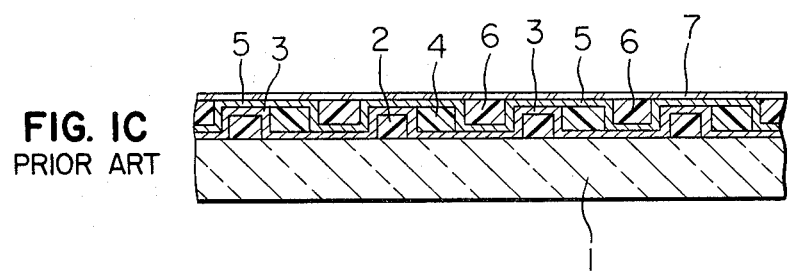
FIG. IC PRIOR ART
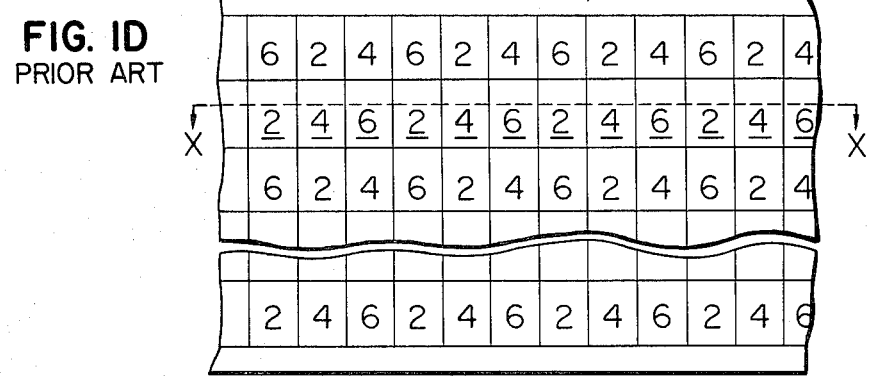
FIG. ID PRIOR ART

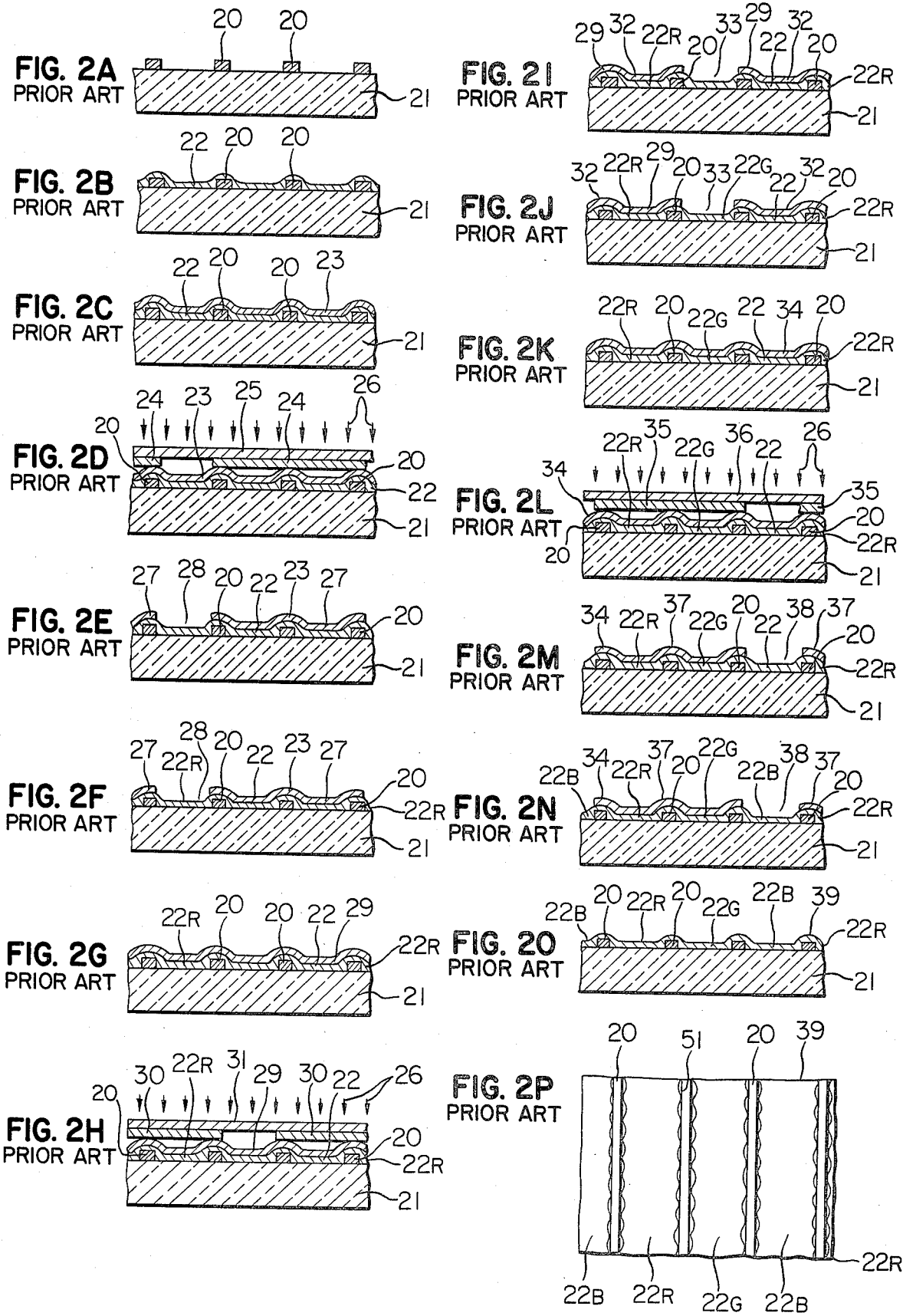

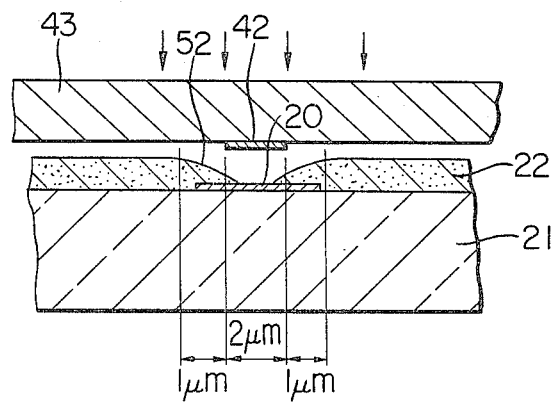
FIG. 4
PRIOR ART
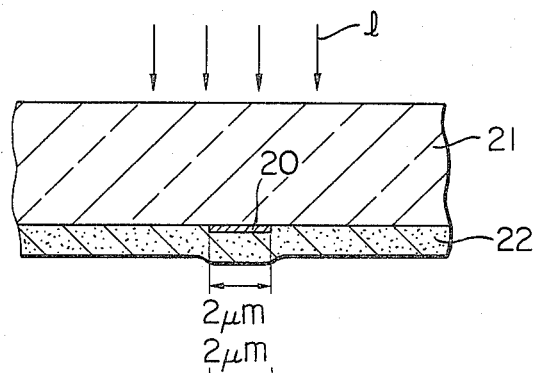
FIG. 6A
FIG. 6B
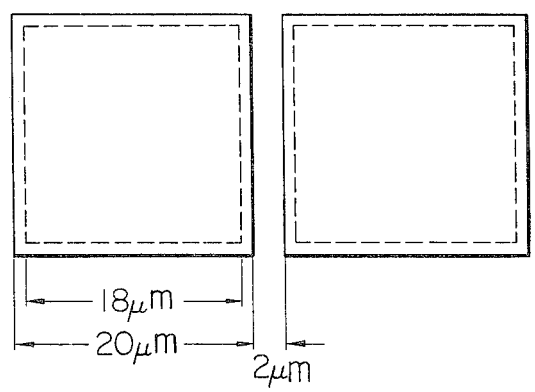
FIG. 7

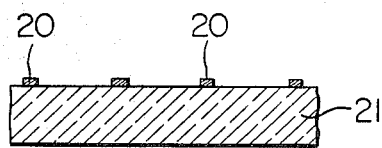
FIG. 5A
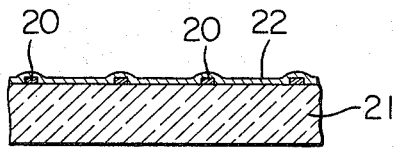
FIG. 5B
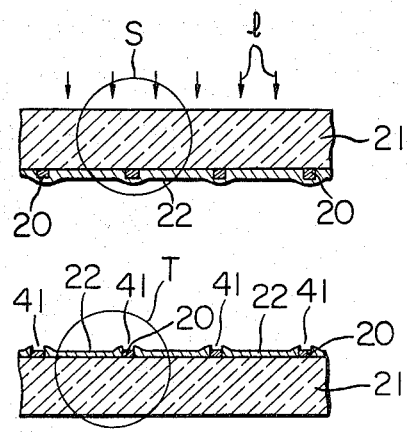
FIG. 5C
FIG. 5D
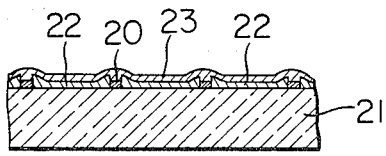
FIG. 5E
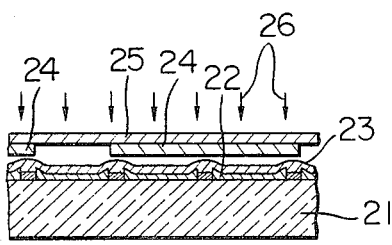
FIG. 5F
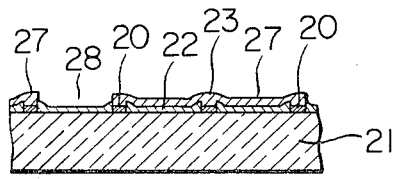
FIG. 5G
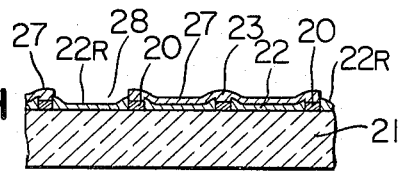
FIG. 5H
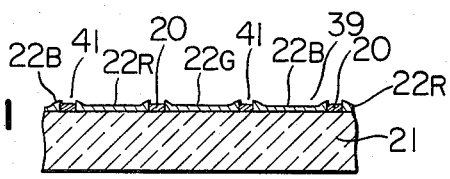
FIG. 5I
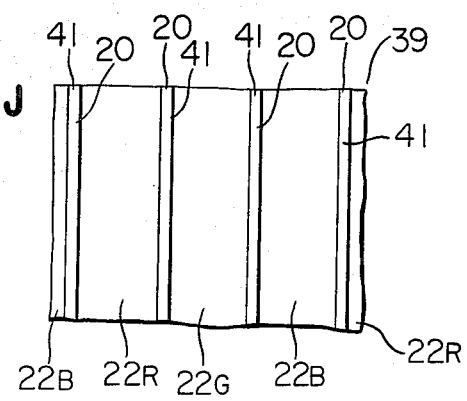
FIG. 5J

METHOD FOR MANUFACTURING COLOR FILTER

BACKGROUND OF THE INVENTION

The present invention relates to a method for manufacturing a color filter used for a color TV camera or the like.

There are basically two conventional methods for manufacturing the color filter of this type.

According to the first method, first to third color base films of predetermined patterns are formed on a glass substrate with a transparent resist film interposed between each pair of adjacent base films so that the first to third color base films do not overlap with each other. The first color base film is directly formed on the glass substrate. The second color base film is formed on a first resist film and the third color base film is formed on a second resist film. The first to third color base films are formed under different conditions, resulting in a difference in adhesion and peel-off of the base films. Further, steps are formed between the color base films. Therefore, printing resolution in the second color and then in the third color is degraded, resulting in blurs of the patterns.

According to the second method, a stripe-shaped light-shield metal film is formed on a glass substrate. Thereafter, a base film to be dyed is formed to cover the entire surface. A first photoresist film is then formed on the base film. First windows are formed at predetermined positions defined by the light-shield metal film. The base film is selectively dyed with a first color (e.g., red) through the first windows. Similarly, second windows are formed at predetermined positions adjacent to the first windows, using a second photoresist film as a mask. The base film is selectively dyed with a second color (e.g., green) through the second windows. Further, third windows which do not overlap the first and second windows are formed using a third photoresist film as a mask. The base film is then selectively dyed with a third color (e.g., blue) through the third windows.

However, since the base film which is formed on the light-shield metal film is horizontally continuously dyed with different colors, each color tends to spread horizontally and the different colors may be mixed at their boundaries, resulting in degradation of optical characteristics.

In order to prevent spreading of colors, grooves are formed to divide the color base film on the light-shield metal film into layers of different colors. The groove patterns are printed and developed using the photoresist films as masks. However, if the width of the light-shield metal film is as small as 2 to 3 μm, the base film to be dyed may be etched due to imprecise masking and alignment errors, thus decreasing the yield of the color filters. The color base film is exposed by warped light beams and pattern edges thereof are rounded. The color at the rounded portions becomes light and the distinct boundaries of the color layers cannot be obtained.

Cl SUMMARY OF THE INVENTION

It is, therefore, an object of the present invention to provide a method for manufacturing a color filter wherein color pattern layers are formed on the same plane and do not have steps among the colored pattern layers, and adjacent colored pattern layers are separated from each other properly so as to prevent spreading of the color pattern layers, thus preventing color mixing.

According to a method for manufacturing a color filter of the present invention, a stripe- or lattice-shaped light-shield pattern is formed on one major surface of a transparent glass substrate. A photosensitive base film is formed to cover the entire surface of the glass substrate through the light-shield pattern. Light is then radiated on the other major surface of the glass substrate, using the light-shield pattern as a mask. Thus, the base film is exposed and nonexposed portions of the base film which are immediately above the mask are etched. Simultaneously, highly elaborate grooves are formed properly to isolate the adjacent colored pattern layers from each other.

As a result, a mask for isolating the adjacent colored pattern layers from each other need not be prepared separately. The alignment error does not substantially occur. The pattern edges may not be rounded. Therefore, a color filter has distinct boundaries of the colored pattern layers to provide large effective areas.

BRIEF DESCRIPTION OF THE DRAWINGS

FIGS. 1A to 1C are sectional views showing a first conventional method for manufacturing a color filter;

FIG. 1D is a plan view of the color filter manufactured by the first conventional method;

FIGS. 2A to 2O are sectional views showing a second conventional method for manufacturing a color filter;

FIG. 2P is a plan view of the color filter manufactured by the second conventional method;

FIG. 4 is an enlarged view of portion R in FIG. 3C;

FIGS. 5A to 5I are sectional views showing a method for manufacturing a color filter according to one embodiment of the present invention;

FIG. 5J is a plan view of the color filter manufactured by the method shown in FIGS. 5A to 5I;

FIG. 6A is an enlarged view of portion S in FIG. 5C;

FIG. 6B is an enlarged view of portion T in FIG. 5D; and

FIG. 7 is a view showing the effective area of the color base film manufactured by the method of the present invention in comparison with that of the color base film manufactured by the second conventional method.

DETAILED DESCRIPTION OF THE PRIOR ART

Figure 3A:
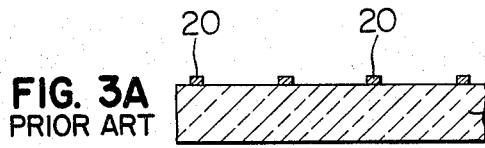
FIGS. 3A to 3I are sectional views showing a third conventional method for manufacturing a color filter which is an improvement over the second conventional method.

A first conventional method for manufacturing a color filter is shown in FIGS. 1A to 1D. Ammonium dichromate is added to polyvinyl alcohol, a glue, gelatine, casein or the like to obtain a sensitizer. The sensitizer is then applied by roller coating, dipping or spinning to uniformly cover the surface of a glass substrate 1 which is optically polished. After the sensitizer is dried, a pattern layer to be dyed by a first color is optically hardened by masking. The hardened pattern layer 2 is then developed and an unnecessary sensitizer portion is etched away to obtain a base film 2. The base film 2 is dyed by a first dye with a predetermined spectral characteristic. A transparent resist film 3 which may not be dyed is formed to cover the entire surface.

The sensitizer is then applied uniformly to cover the entire surface, as shown in FIG. 1B. After the sensitizer is dried, a base film 4 to be dyed by a second color is optically hardened by masking. The hardened base film 4 is then developed and an unnecessary sensitizer portion is etched away. The base film 4 is dyed by a second dye with a predetermined spectral characteristic. A transparent resist film 5 is then formed to cover the base film 4.

As shown in FIG. 1C, the same sensitizer is applied uniformly to cover the resist film 5. After the sensitizer is dried, a base film 6 to be dyed by a third color is optically hardened by masking. The hardened base film 6 is then developed and an unnecessary sensitizer portion is etched away. The base film 4 is dyed by a third dye with a predetermined spectral characteristic.

Finally a top layer 7 is formed and a color filter shown in FIG. 1D is manufactured.

However, when the base film 2 of the first color, the base film 4 of the second color and the base film 6 of the third color are formed according to the above-mentioned method, substrate conditions differ from each other. More particularly, as shown in FIG. 1C, the base film 2 of the first color is directly formed on the glass substrate 1. The base film 4 of the second color is formed on the resist films 3. The base film 6 of the third color is formed on the resist films 3 and 5.

Adhesion of the sensitizer to the glass substrate 1 differs from that to the resist films 3 and 5. Therefore, if a sensitizer which is easily adhered to the glass substrate 1 is used, the interface between the base film and the resist film is subject to peeling. At present, defective color filters are manufactured for this reason. Further, since the base films of the first, second and third colors have respective steps, pattern resolution is degraded when the base layers of the second and third colors are subsequently formed on the base film of the first color through the resist films. As a result, the base films of the second and third colors tend to blur.

A second method for manufacturing a color filter is shown in FIGS. 2A to 2P. A metal layer 20 comprising a strip-shaped light-shield pattern film of a deposited metal such as Cr is formed on a transparent glass substrate 21, as shown in FIG. 2A. The metal layer 20 is used as a shield for shielding part except for the photodiode of the solid state image pickup element from light noise.

A base film 22 (to be referred to as a resin film hereinafter) is formed on the glass substrate 21 to a thickness of 3 to 5 $\mu$m, as shown in FIG. 2B.

A photoresist film 23 (AZ1350J: manufactured by Schpray Inc.) is formed on the resin film 22 to a thickness of 5,000 Å, as shown in FIG. 2C by spinning. The photoresist film 23 is dried at a temperature of 60° to 75° C. for 5 to 10 minutes. A glass plate 25 has a mask 24 which has a predetermined pattern and is formed by an emulsion or Cr, as shown in FIG. 2D. This glass plate 25 is placed on the photoresist film 23 and radiated by light beams 26 from a mercury lamp.

The photoresist film 23 thus exposed is developed. In this example, since positive development is performed, as shown in FIG. 2E, the exposed portion is removed to selectively form a resists film mask 27 (nonexposed portion) and a nonmasking portion 28 (removed portion). The resist film mask 27 must be able to prevent osmosis of the dye in the subsequent manufacturing steps.

The resin film 22 which is selectively covered with the resist film mask 27 is dipped in a liquid dye such as Congo red for 30 to 40 seconds. The resin film 22 is dyed in red through the nonmasking portion 28. As shown in FIG. 2F, a red layer 22R is formed.

A photoresist film 29 is formed on the resin film 22 again, as shown in FIG. 2G.

A glass plate 31 has a mask 30 having a pattern different from that of the mask 24 and is placed on the photoresist film 29, as shown in FIG. 2H. The glass plate 31 is radiated by the light beams 26 from the mercury lamp.

The exposed photoresist film 29 is developed to remove the exposed portion and to leave the nonexposed portion. In other words, a resist film mask 32 and a nonmasking portion 33 are formed, as shown in FIG. 2I.

The resin film 22 which is selectively covered with the resist film mask 32 is dipped in a mixture of liquid dyes such as Suminor yellow and Patent blue for 30 to 40 seconds. The resin film 22 is dyed in green through the nonmasking portion 33. A green layer 22G is formed adjacent to the red layer 22R, as shown in FIG. 2J.

Similarly, as shown in FIG. 2K, a photoresist film 34 is applied to the surface of the resin film 22.

A glass plate 36 has a mask which has a pattern different from the masks 24 and 30. The glass plate 36 is then placed on the photoresist film 34 and radiated by the light beams 26 from the mercury lamp, as shown in FIG. 2L.

The exposed resin film 22 is then developed. The exposed portion is removed from the resin film 22 and the nonexposed portion thereof remains, as shown in FIG. 2M. That is, a resist film mask 37 and a nonmasking portion 38 are formed.

The resin film 22 which is selectively covered with the resist film mask 37 is dipped in a liquid dye such as Diacotton blue to form a blue layer 22B, as shown in FIG. 2N. Thereafter, the resist film mask 37 is removed to complete a color filter 39 having the red layer 22R, the green layer 22G and the blue layer 22B, as shown in FIGS. 2O and 2P.

However, according to the second conventional method for manufacturing the color filter as described above, since the resin film 22 which can be dyed is formed on the metal layer 20, spreading of the dye in the horizontal direction is not completely prevented. If the width of the metal layer 20 which is formed in the boundary is as small as 2 to 3 $\mu$m and the thickness of the resin film is more than 1 $\mu$m, a mixed color portion 51 is formed, thus degrading the optical characteristics of the filter.

Further, a third conventional method for manufacturing a color filter is shown in FIGS. 3A to 3J wherein the second conventional method is improved so as to prevent color mixing. The same reference numerals as in the second conventional method denote the same parts in the third conventional method, and a detailed description thereof will be omitted.

The strip-shaped metal layer 20 is formed on the glass substrate 21, as shown in FIG. 3A.

A polyvinyl alcohol resin film 22 to which ammonium dichromate is added is prepared as a sensitizer.

Figure 3B:
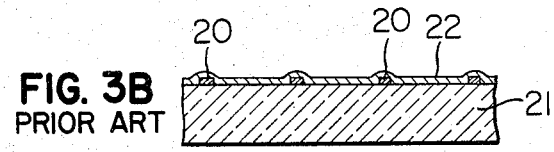

This resin film 22 is formed on the glass substrate 21 to a thickness of 3 to 5 $\mu$m, as shown in FIG. 3B.

Figure 3C:
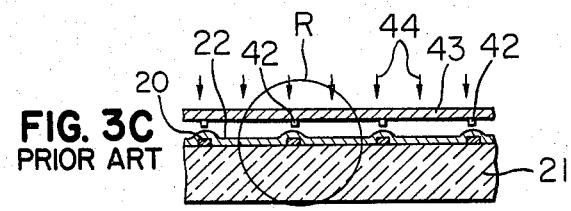

A glass plate 43 which has a mask 42 of a predetermined pattern is placed on the resin film 22, as shown in FIG. 3C. The resin film 22 is then radiated by light beams 44 from a mercury lamp.

Figure 3D:
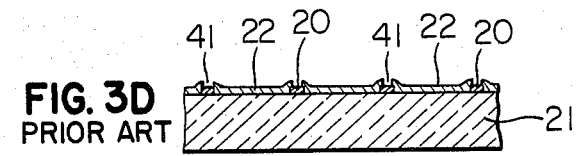

The exposed resin film 22 is developed. A nonexposed portion of the resin film 22 is removed to form stripe-shaped grooves 41 on the metal layer 20, as shown in FIG. 3D. The resin film 22 on the metal layer 20 is etched to isolate the adjacent color layers. FIG. 4 is an enlarged view of portion R in FIG. 3C.

Figure 3E:
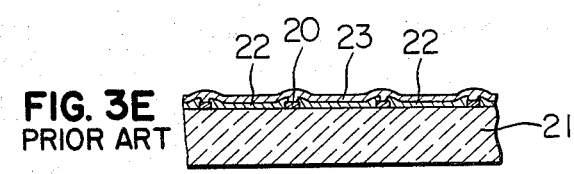

The photoresist film 23 is formed by a spinner on the resin film 22 to a thickness of about 5,000 Å, as shown in FIG. 3E. The photoresist film 23 is then dried at a temperature of 60° to 75° C. for 5 10 minutes.

Figure 3F:
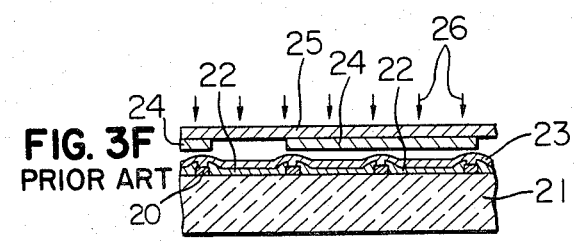

As shown in FIG. 3F, the glass plate 25 which has the mask 24 of the predetermined pattern is placed on the photoresist film 23. The photoresist film 23 is radiated by the light beams 26 from the mercury lamp.

Figure 3G:
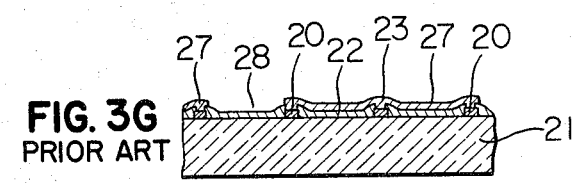

The exposed photoresist film 23 is developed. Since the positive photoresist film 23 is used, the exposed portion is removed. As shown in FIG. 3G, a resist film mask 27 (nonexposed portion) and a nonmasking portion 28 (removed portion) are selectively formed.

Figure 3H:
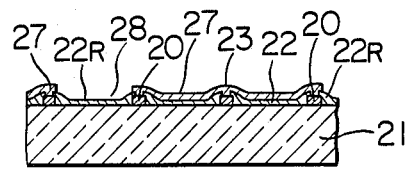

The resin film 22 which is selectively covered with the resist film mask 27 is dipped in a liquid dye such as Congo red for 30 to 40 seconds. The resin film 22 is selectively dyed in red through the nonmasking portion 28. The red layer 22R is formed on the resin film 22, as shown in FIG. 3H.

Figure 3I:
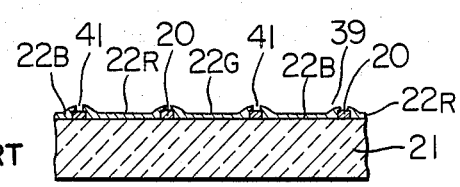
Figure 3J:
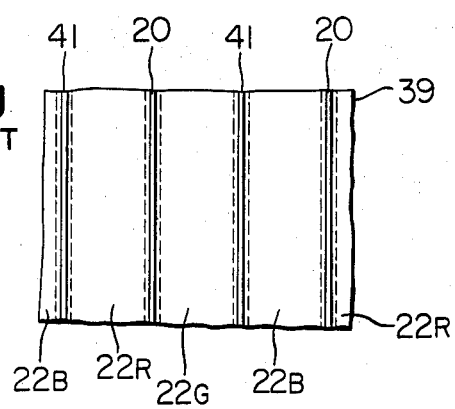
FIG. 3J is a plan view of the color filter manufactured by the third conventional method.

Similarly, selective dyeing operation is performed to form the color filter 39 having the red, green and blue layers 22R, 22G and 22B which are sequentially aligned in a striped-shape, as shown in FIGS. 3I and 3J.

According to this third conventional method, the colored layers do not substantially spread horizontally because of presence of the grooves 41. However, alignment errors of the mask 42 occurs and the masking precision is degraded. Therefore, if the pattern width of the metal layer 20 is as small as 2 to 3 μm, it is very difficult to eliminate only the resin film portions immediately above the pattern, resulting in elimination of the resin portions to be dyed.

Further, since the mask 42 is not in tight contact with the resin film 22 in the exposure operation, the light beams are warped and radiated on the resin 22 through the mask 42. If this phenomenon occurs, rounded edge portions 52 of the resin film 22 are formed, as shown in FIG. 4. For example, if the width of the mask pattern 42 is 2 μm and the resin film 22 thickness is 2 μm, the length of the rounded portion is about 2 μm. Color in the rounded portions 52 becomes lighter. Therefore, the precise boundary is not determined. This third method is not effective for industrial applications, either.

DESCRIPTION OF THE PREFERRED EMBODIMENTS

A method for manufacturing a color filter according to one embodiment of the present invention is shown in FIGS. 5A to 5J. The same reference numerals as in the second conventional method denote the same parts in the method according to the present invention, and a detailed description thereof will be omitted.

The stripe-shaped metal layer 20 which functions as a light-shield pattern is formed on the glass substrate 21, as shown in FIG. 5A.

A water-soluble sensitizer resin film 22 which comprises polyvinyl alcohol, casein or gelatine and to which ammonium dichromate is added is formed on the glass substrate 21 to a thickness of 1 to 2 μm, as shown in FIG. 5B.

Light beams 1 from the mercury lamp are radiated on a surface of the glass substrate 21 on which the resin film 22 is not formed, as shown in FIG. 5C.

The exposed resin film 22 is developed. The nonexposed portion of the resin film 22 on the metal layer 20 is removed to form the stripe-shaped grooves 41 to divide the resin film on the metal layer 20, as shown in FIG. 5D.

As shown in FIG. 5E, the photoresist film 23 is formed by a spinner on the resin film 22 to a thickness of about 5,000 Å. The photoresist film 23 is then dried at a temperature of 60° to 75° C. for 5 to 10 minutes.

The glass plate 25 which has the mask 24 of the predetermined pattern is placed on the photoresist film 23, as shown in FIG. 5F. The photoresist 23 is then radiated by the light beams 26 from the mercury lamp.

The exposed photoresist film 23 is then developed. Since the positive photoresist film 23 is used, as shown in FIG. 5G, the exposed portion is removed to form the resist film mask 27 comprising the residual photoresist film 23 (nonexposed portion) and the nonmasking portion 28 (removed portion). If a negative photoresist film is used, the monochromatic pattern of the mask may be reversed.

The resin film 22 which is selectively covered with the resist film mask 27 is dipped in a liquid dye such as Congo red for 30 to 40 seconds to form the red layer 22R, as shown in FIG. 5H.

Similarly, selective dyeing operation is performed to manufacture the color filter 39 having the red, green and blue layers 22R, 22G and 22B which are alternately aligned, as shown in FIGS. 5I and 5J.

A top layer for protecting the color layers 22 may be formed as needed.

FIG. 6A is an enlarged view of portion S in FIG. 5C and FIG. 6B is an enlarged view of portion T in FIG. 5D.

According to the method for manufacturing the color filter of the present invention, as shown in FIG. 6A, the resin film 22 is completely adhered to the light-shield metal layer 20 when exposure is preformed. Further, only the resin film 22 immediately above the metal layer 20 is eliminated in a self-aligned manner. Therefore, another photoresist mask need not be prepared.

Further, since the metal layer 20 is used as a mask, the alignment error does not substantially occur so that the portions of the resin film to be dyed completely remain, as shown in FIG. 6B.

The material of the metal layer 20 is not limited to a meetal. A material such as Cr, $Cr_2O_3$ or the like, a film of which has a thickness of several thousand angstroms and sufficiently shields light beams may be used to form a pattern of a width which is as small as 1 to 2 μm. Thus, the resin film is exposed in a self-aligned manner, so that a highly precise color filter having small grooves (e.g., about 2 μm) for separating the color layers is manufactured.

Further, since exposure is performed from the rear surface, as shown in FIG. 6B, the distinct resin film pattern is obtained. The edges of the resin film in the vicinity of the metal layer 20 may not be thinner. However, in the conventional method for performing exposure from the front surface, the mask is not in tight contact with the resin film. Thus, when development is performed, the rounded pattern edges 52 are formed, as shown in FIG. 4. If the width of the metal layer 20 is small, the resin film becomes thinner at the boundary of the metal layer and the resin film. The color in the boundary becomes lighter.

If ammonium dichromate is added to sensitize the resin film comprising polyvinyl alcohol, casein, gelatine or the like, the resin film becomes a negative type. However, generally, the rounded edges tend to be formed and clear patterning cannot hardly be formed in the negative resin film.

In the above embodiment, the resin layer is separated before dyeing. However, a colored sensitizer resin layer may be exposed to light from the rear surface to divide into portions.

In order to form a color layer (region) of 20 $\mu m \times 20$ $\mu m$ size which is indicated by the solid lines in FIG. 7, the rounded portions shown in FIG. 4 which have respectively lengths of 1 $\mu m$ are formed at both edges of the resin film according to the method shown in FIG. 3. The area of the color layer is reduced to 18 $\mu m \times 18$ $\mu m$. However, according to the method of the present invention, the effective color area is increased, thus improving the performance of the filter.

What is claimed is:

1. A method for manufacturing a color filter comprising:
   (a) forming a stripe -or lattice- shaped light-shield film on one major surface of a transparent glass substrate;
   (b) forming a photosensitive resin film to be dyed on said one major surface of said glass substrate on which said light-shield film is formed;
   (c) exposing said resin film by radiating light from the other major surface of said glass substrate, using said light-shield film as a mask, and developing said resin film, thereby removing a nonexposed portion of said resin film on said light shield film; and
   (d) forming a photoresist film over said light-shield film and said resin film;
   (e) exposing said photoresist film through a mask having a predetermined pattern thereon;
   (f) developing said exposed photoresist film to selectively form an opening therein which corresponds to a portion of said resin film be dyed, a residual portion of said photoresist film being provided as an antidye mask;
   (g) dying the portion of the resin film which is uncovered in the opening of the photoresist film; and
   (h) removing said photoresist film.

2. A method according to claim 1, wherein steps (d), (e), (f), (g) and (h) are repeated a plurality of times.

3. A method according to claim 1 wherein said unexposed resin film is water soluble.

4. A method according to claim 1, wherein said light-shield film comprises a metal film.

* * * * *